United States Patent [19]

Netz et al.

[11] Patent Number: 5,793,500
[45] Date of Patent: Aug. 11, 1998

[54] DEVICES AND METHODS FOR OFFSET AND SIMILAR PRINTING SYSTEMS

[76] Inventors: Yoel Netz, 5 Massada, Bat Yam; Arnold Hoffman, 5 Hagra, Rehovat, both of Israel

[21] Appl. No.: 184,175

[22] Filed: Jan. 21, 1994

Related U.S. Application Data

[63] Continuation of Ser. No. 981,891, Nov. 23, 1992, Pat. No. 5,283,140, which is a continuation of Ser. No. 553,425, Jul. 17, 1990, abandoned.

[30] Foreign Application Priority Data

Jul. 20, 1989 [IL] Israel .................................. 90154

[51] Int. Cl.⁶ .................................................. H04N 1/40
[52] U.S. Cl. ........................... 358/456; 358/534; 358/536
[58] Field of Search .................................. 358/534–536, 358/429, 456–461, 298

[56] References Cited

U.S. PATENT DOCUMENTS

| | | | |
|---|---|---|---|
| 4,081,828 | 3/1978 | Jones et al. | 358/534 |
| 4,084,183 | 4/1978 | Keller et al. | 358/534 |
| 4,274,218 | 6/1981 | Harvey | 40/505 |
| 4,543,613 | 9/1985 | Sakamoto | 358/298 |
| 4,547,812 | 10/1985 | Waller et al. | 358/283 |
| 4,598,040 | 7/1986 | Netz et al. | 430/405 |
| 4,700,235 | 10/1987 | Gall | 358/283 |
| 4,768,101 | 8/1988 | Webb | 358/298 |
| 4,987,498 | 1/1991 | Shimazaki | 358/429 |
| 5,283,140 | 2/1994 | Netz et al. | 430/6 |
| 5,323,245 | 6/1994 | Rylander | 358/536 |
| 5,383,033 | 1/1995 | Takahashi | 358/456 |
| 5,471,543 | 11/1995 | Ng et al. | 358/456 |

FOREIGN PATENT DOCUMENTS

| | | |
|---|---|---|
| 0 370 271 A2 | of 1989 | European Pat. Off. |
| 262065 | of 1913 | Germany. |
| 477540 | of 1929 | Germany. |
| 26 17 683 | of 1976 | Germany. |
| 2-244047 | 9/1990 | Japan. |

OTHER PUBLICATIONS

Goren, R.N., "High Quality Pictorial Xerographic Reproduction By Halftone Screening", Electrophoyography 4th International Conference, Washington, D.C. (1981) pp. 299–317.

"Filme und Platten Rasterphotographie", found in Moderne Chemigraphie in Theorie und Praxis, Polygraph Verlag GmbH, Frankfurt 1957, pp. 91–100.

Ulichney, R., "Digital Halftoning", The MIT Press, Cambridge, Mass. (1988), preface, p. 2 and Chap. 5.

"Publish", Jun. 1991, p. 76.

*Primary Examiner*—Stephen Brinich
*Attorney, Agent, or Firm*—Mark M. Friedman

[57] ABSTRACT

A method for producing a half-tone image faithfully representing a continuous-tone original includes a step of forming in the image a pattern of substantially continuous, substantially parallel lines at a frequency of between about 100 and 400 lines per inch, such that the width of the lines at a given point in the image varies in relation to the optical density of at least one color component at a corresponding point in the continuous-tone original. The method may be used for color separations with each separation produced by scanning at a different angle. The method may be implemented using photomechanical or electronic scanning techniques.

5 Claims, 11 Drawing Sheets

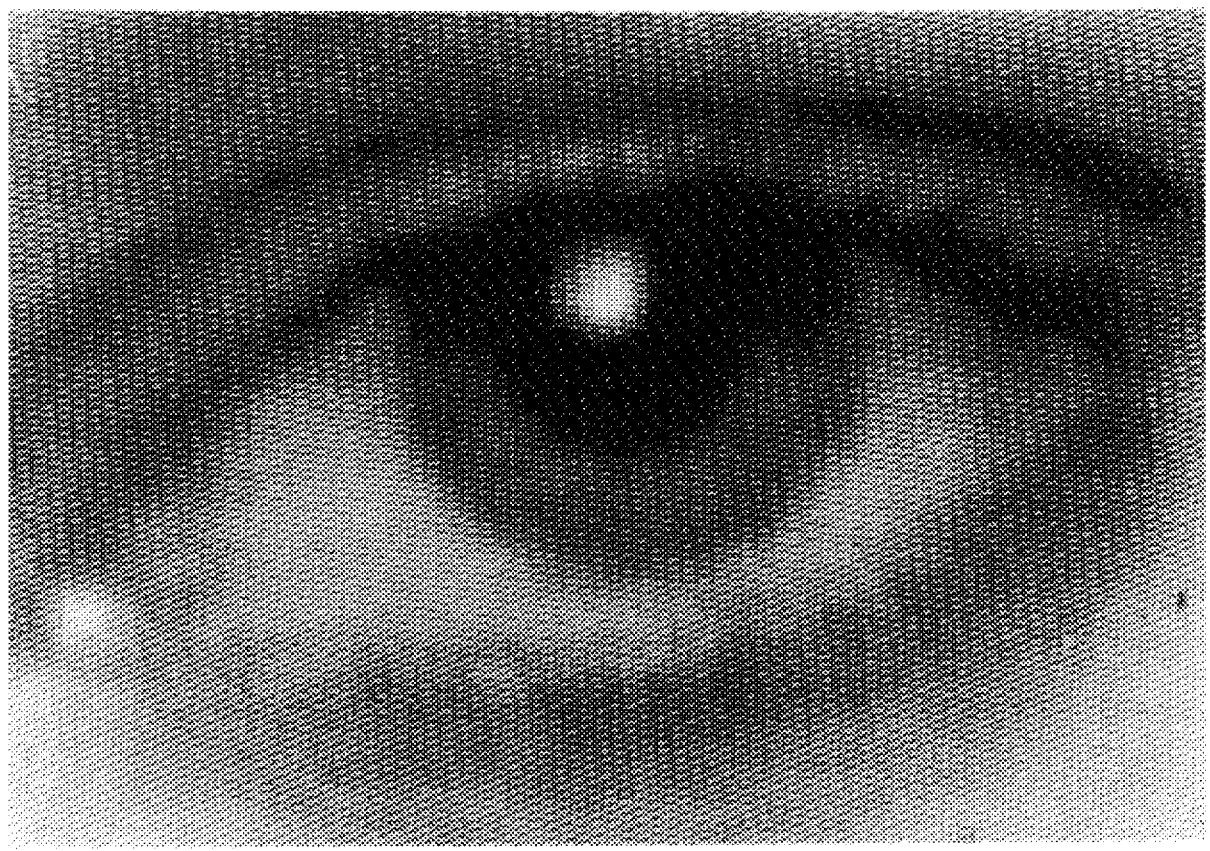
FIG. 5a - I

DEVICES AND METHODS FOR OFFSET AND SIMILAR PRINTING SYSTEMS

This application is a continuation of Ser. No. 08/981,891, filed Nov. 23, 1992, now U.S. Pat. No. 5,283,140, which is a continuation of Ser. No. 08/553,425, filed Jul. 17, 1990, now abandoned.

FIELD AND BACKGROUND OF THE INVENTION

The present invention relates to devices and methods for offset and similar printing systems.

More particularly, the present invention relates to devices and methods for screening information from a continuous tone original to produce a halftone image on a photosensitive layer.

In particular, the invention relates to a novel screen, photo-mechanically or electronically generated, for the preparation of offset or similar printing plates to be used in offset or similar printing of halftone copies of continuous tone originals.

There exists a wide variety of photomechanical screens. Their purpose is to break up the continuous tone information of the original into discrete dots, whose size is related to the optical density of the original. The resultant film, upon processing, produces a "dot" image of the original.

In the prior art systems all the dots, which are small enough for the eye to reconstruct into a coherent image are of equal opaque optical density while their relative sizes produce the impression of various gray values. The practical resolution of these screens, and those generated electronically (e.g. via an Electronic Dot Generator Scanner) is usually about 100–200 dots/inch.

In the past, the standard screen utilized an array of symmetrical round or square dots. The details of the original reproduced through such a screen are determined by the arbitrary geometrical centers of the dots in the screen. Further, in the resulting halftone, until 50% dot density one has black dots on a transparent background. An abrupt jump in the tonal scale occurs at 50%, where the four corners of the square dot join at 50%. This discontinuity prevents smooth midtone transitions.

To overcome the latter limitation, an elliptical, diamond, multi-dot or star-like dot pattern is mainly used in modern offset printing. These dot shapes allow a smoother tonal gradation than the square dot, in the 50% area. Two opposite corners of e.g., the diamond shaped dot, join the adjacent dots first at about 40%, while the other two remaining corners join adjacent dots, near 60%. Since the dots join in two steps, a smoother tonal transformation is achieved. This strategy, of having adjacent dots join in multiple steps, is used, for example, in the Double Dot Policrom Screen and the Triplet Dot HRS Beta Screen. The result is smoother, but far from ideal, as the abrupt jump in tonal scales is only attenuated to some degree. Aside from these jumps the image remains discontinuous in the X and Y direction because of the spacing between the dots in both directions which becomes more apparent with a lower screen ruling.

SUMMARY OF THE INVENTION

In contradistinction to said prior art photomechanical screens and methods, using the same or involving electronically generating an effective electronic equivalent thereof, the present invention now provides a device for offset and similar printing methods from a continuous tone original to produce a halftone image on a photosensitive layer comprising means for screening said information via a first array of parallely extending lines of effective minimum optical density and a second array of parallely extending lines of effective maximum optical density, said arrays being interposed to form a composite array of substantially parallel, spaced-apart, alternating lines of maximum and minimum optical density, said lines delimiting therebetween zones of effective graduated optical density, the gradient inside each zone progressively varying from low optical density adjacent lines of said first array to high optical density adjacent lines of said second array, the spacing of lines of said first array being between about 100 and 400 lines per inch and wherein the resulting thickness of each reproduced line on a resulting developed photosensitive layer, generated by screening said information via said array, continuously varies as a function of the density of each information point of the original.

In a preferred embodiment of the present invention there is now provided a photomechanical screen for offset and similar printing methods by screening information from a continuous tone original to produce a halftone image on a photosensitive layer, said screen comprising a first array of parallely extending lines of minimum optical density and a second array of parallely extending lines of maximum optical density, said arrays being interposed to form a composite array of substantially parallel spaced-apart, alternating lines of maximum and minimum optical density, said lines delimiting therebetween zones of graduated optical density, the gradient inside each zone progressively varying from low optical density adjacent lines of said first array to high optical density adjacent lines of said second array, the spacing of lines of said first array being between about 100 and 400 lines per inch and wherein the resulting thickness of each reproduced line on a resulting developed photosensitive layer, generated by screening said information via said array, continuously varies as a function of the density of each information point of the original.

The invention also provides a method for generating a halftone image from a continuous tone original comprising exposing a commercial lith or line film to a continuous tone original via a device as hereinbefore defined wherein the resulting thickness of each resulting line generated on said developed lith or line film continuously varies as a function of the density of each information point of the original.

A preferred embodiment of the present method comprises electronically outputting the information of the original onto an unexposed scanner type film, in an electronic output simulating a screen format,as defined above, the pattern of this screen being lines spaced 100–400 lines/inch without this film being in contact with a standard photomechanical screen.

In another aspect of the present invention there is also provided a method for generating a halftone image from a continuous tone original comprising outputting the information of the original onto an unexposed scanner-type film, in an electronic output simulating a screen format, the pattern of this screen in a screen format, the pattern of this screen being a first array of parallely extending lines of effective minimum optical density and a second array of parallely extending lines of effective maximum optical density, said arrays being interposed to form a composite array of substantially parallel, spaced-apart, alternating lines of effective maximum and minimum optical density, said lines delimiting therebetween zones of effective graduated optical density, the gradient inside each zone progressively varying from low optical density adjacent lines of said first array to high optical density adjacent lines of said second array, the spacing of lines of said first array being between about 400–600 lines per inch and developing in a lith developer containing a hydroquinone developing agent in combination with carbonate, bicarbonate and halide salt together with sodium formaldehyde sulfoxylate and formaldehyde wherein a resulting thickness of each resulting line generated on said scanner type film continuously varies as a function of each information point of the original, but does not decrease in the Dmin region beyond 5 microns width even when the generated line becomes segmented.

In U.S. Pat. No. 4,768,101 there is disclosed a method of generating a half-tone representation of an image from digital data defining the color content of pixels arranged in a series of substantially parallel input scan lines.

U.S. Pat. No. 4,700,235 discloses a method and apparatus for producing half-tone printing forms with screens having arbitrary screen angles and screen width.

U.S. Pat. No. 4,833,546 discloses a photomechanical apparatus adapted to print a half-tone picture corresponding to an original continuous tone picture on the basis of tonal information signals obtained by photoelectrically scanning the original continuous tone picture.

U.S. Pat. No. 4,547,812 discloses a method and apparatus for forming high resolution half-tone images.

U.S. Pat. No. 4,543,613 discloses a method for producing half-tone dots in a half-tone plate recording apparatus.

As will be realized none of said patents teach or suggest the device and method of the present invention.

The present invention provides a screen capable of producing a final printed, ink on paper, resolution of 100–400 lines/inch, which generates a continuous variation in tonal value in one direction, by using a screen composed of fine lines, 100–400 lines/inch. For example, at 250 lines per inch parallel to the direction of the lines, one would say, using prior art concepts and terminology that the segments of a line join to generate an effectively continuous line at about 5–6% dot density. Perpendicular to the direction of the lines, the adjacent lines partially join above 90% dot density.

According to proposed terminology applicable to the novel concept of the present new invention in fact a continuous information straight line from the original, parallely aligned and screened via a line of minimum optical density of the present screening array will be reproduced as a continuous line.

Similarly in the present screening array the width of each line segment is determined by the density of each information point of the original, each such segment having its center along a line of minimum optical density and extending continuously perpendicularly to the direction of the lines on both sides up to the adjacent bracketing lines of maximum optical density.

Since the "dots" join in two steps outside the operational limits of what would be considered in prior art terms as 5%–90% dot density the tonal transformation is, intrinsically, smooth across the whole tonal range, simply because there are no jumps in tonal scale, within this range, in the direction of the lines. The line screen creates a halftone image by continuously changing the width of the parallel lines, comprising the screen pattern. Thus, unlike "dot" based prior art photomechanical or electronic screens, it renders the original continuous tone, in a continuous format, in one direction. For monocolor work, there remains a discontinuity in the direction perpendicular to the lines. However, even in this direction, the image remains black on a white background, until above about 95% dot density. There is no abrupt change to white on black, which is the major cause of disturbance to the eye.

In multicolor printing, where different angles are employed for each of the separations (e.g., here for the line screen, the optimal angles are, 45°, 90°, 105° and 165°), this discontinuity is attenuated, and the result appears to approach a symmetrical continuous tone to the observer.

A possibly more graphic way of explaining the present invention is to state that while the prior art of which applicants are aware is based on symmetrical dot, diamond, elliptical or multi-dot two-dimensional arrays of varying optical density which could be analogized to the peaks and valleys of an egg tray, the present invention is based on parallely extending lines with effective varying optical density of alternating parallely arranged valleys and ridges analogous to a corrugated roof.

In preferred embodiments of the present invention it has been found that using a screening means wherein the distance between lines of said first array are between about 200 and 300 lines per inch with normal rapid access or lith development, will generate a halftone, that with any plate, ink or press, will produce a finer "continuous tone" reproduction of an original continuous tone, than comparable commercially available screens. This is because, intrinsically, these prior art screens are discontinuous in both the X and Y directions, whereas the line screen of the present invention is continuous in the direction of the line.

As will be seen with reference to FIG. 1 described hereinafter, below 100 lines per inch the eye will perceive the discrete lines of the line screen pattern and thus while Beta Screen Corp. produces a special effect straight line contact screen having a line density of 55 lines/inch, such a lower range cannot be used for the purposes of the present invention.

According to calculations as set forth in example 1 below, much beyond 400 lines/inch, the width of the lines approaches 5μ for 50% dot density. Below 50%, well above the Dmin value, the line has to be less than 5μ, which is too small for graphic art films, so the result is 100% transparent. Over 50%, well below Dmax value, the distance between lines is less than 5μ. Again, graphic art films cannot handle it, and silver image will be joined over this distance, creating solid black. Thus for most uses contemplated the effective upper range should not exceed 400 lines per inch.

BRIEF DESCRIPTION OF THE DRAWINGS

The invention will now be described in connection with certain preferred embodiments with reference to the following illustrative figures so that it may be more fully understood.

With specific reference now to the figures in detail, it is stressed that the particulars shown are by way of example and for purposes of illustrative discussion of the preferred embodiments of the present invention only and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings:

The file of this patent contains at least one color photograph. Copies of this patent with color photograph(s) will be provided by the Patent and Trademark Office upon request and payment of necessary fee.

Figure 1A:
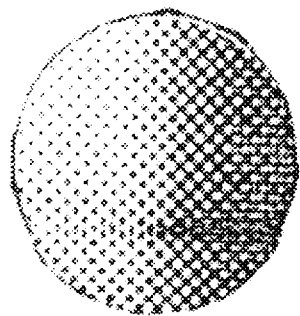
Figure 1B:
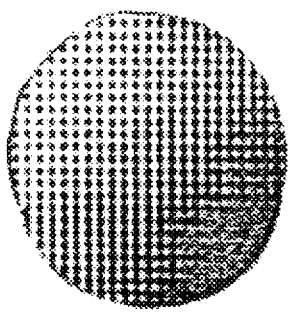
Figure 1C:
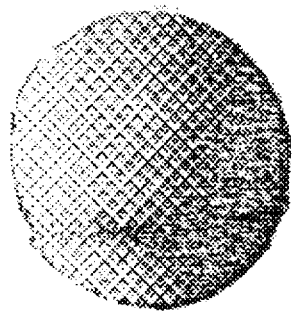

FIGS. 1a, 1b and 1c are representations of dot arrays of prior art photomechanical screens.

Figure 1D:
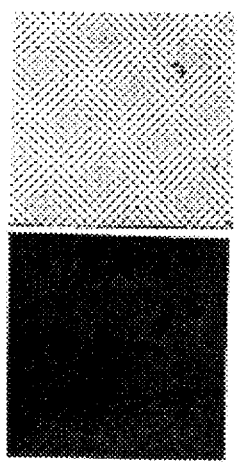

FIG. 1d is a representation of a dot array at a density of 25 and 85 dots per inch, respectively.

Figure 1E:
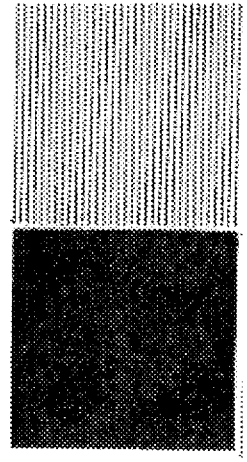

FIG. 1e is a representation of a line array at a density of 25 and 85 lines per inch.

Figure 2:
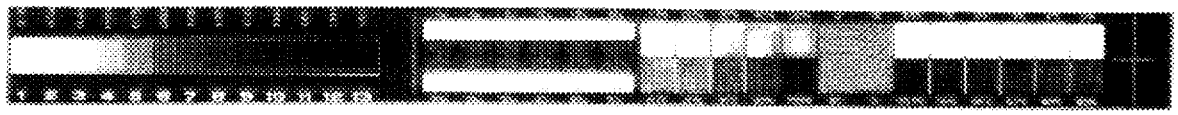

FIG. 2 is a contact of a resolution target produced using prior art film and chemistry.

Figure 3A:

FIG. 3a is a contact positive produced according to the present invention.

Figure 3B:

FIG. 3b is a comparison contact positive produced using a prior art dot screen.

Figure 4:
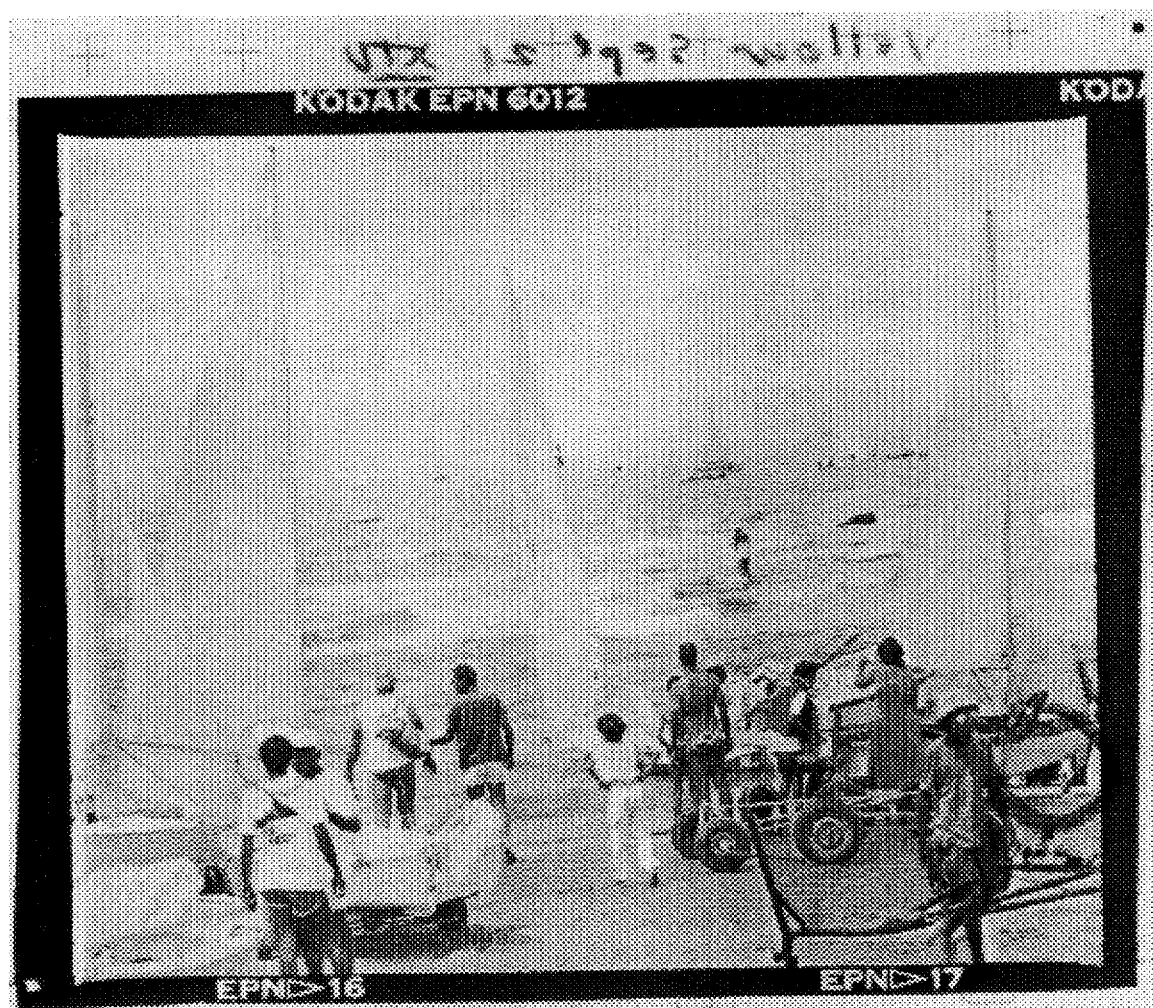

FIG. 4 is a developed scanner film produced using a line density of 500 lines/inch, according to the invention.

Figure 5A:

FIG. 5a is a color photo of a color print produced according to the present invention.

Figure 5B:
Figures 1, 5B:
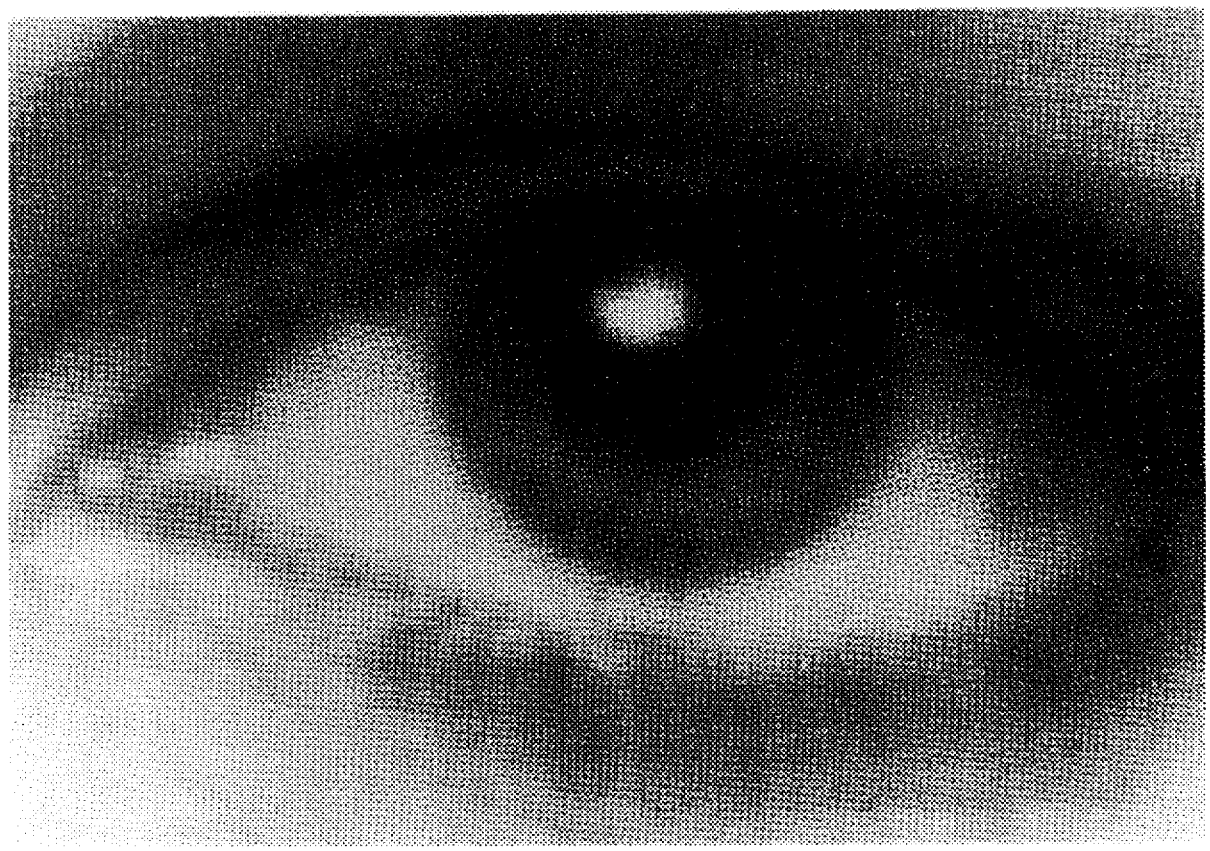

FIG. 5a-1 is an enlargement by about ×8 of the eye of FIG. 5a.

FIG. 5b is a comparison color photo of a color print produced using an electronically generated dot screen according to the prior art.

FIG. 5b-1 is an enlargement by about ×8 of the eye of FIG. 5b.

Figure 6:

FIG. 6 is a color photo of a color print produced according to the present invention.

Figure 6A:
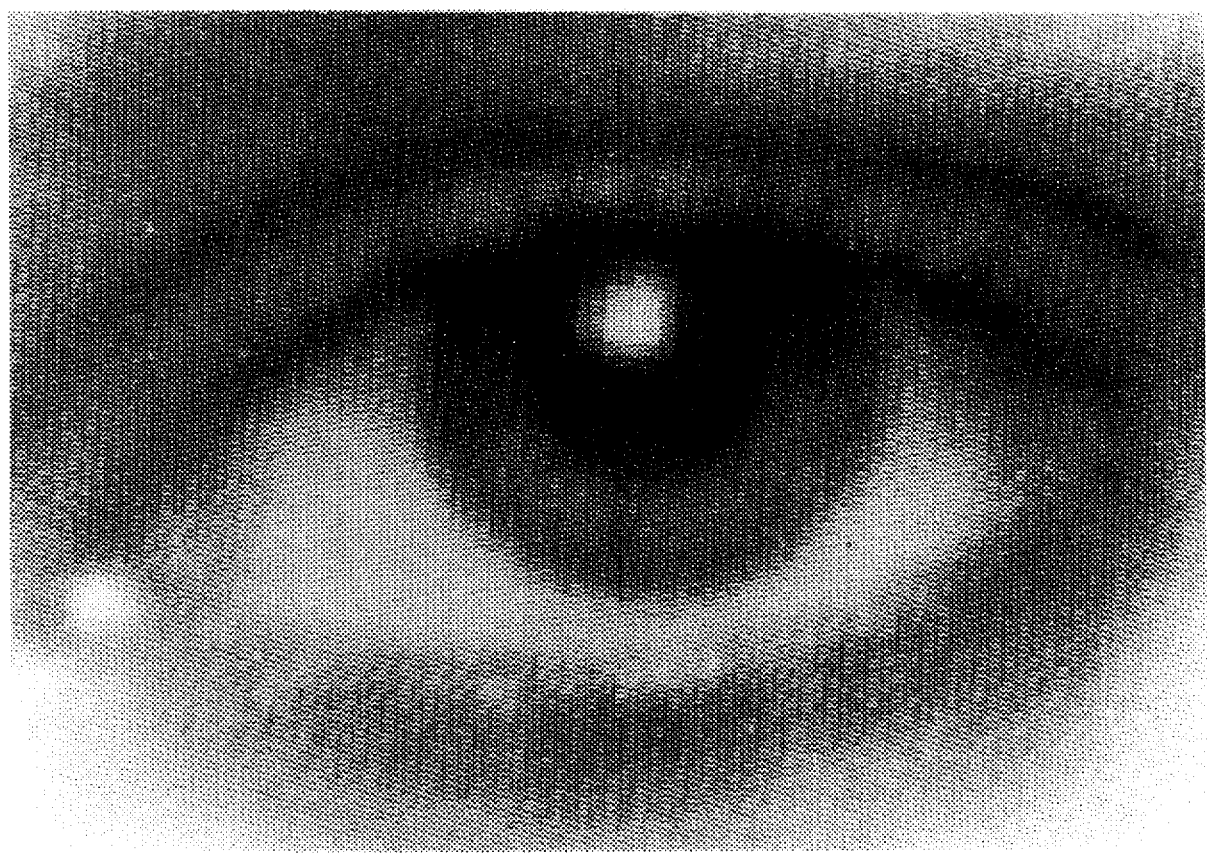

FIG. 6a is an enlargement by about ×8 of the eye of FIG. 6.

Referring now to the drawings in detail, FIGS. 1a, 1b and 1c have merely been provided as background for a better visual understanding of the state of the prior art in which photomechanical contact screen employed arrays of square dots (FIG. 1a), elliptical dots (FIG. 1b) and the HRS Triplet Dot$^{(R)}$ (FIG. 1c) of Beta Screen Corp.

FIGS. 1d and 1e provide a comparison of a standard screen format and a line pattern at a dot and line density of 25 and 85 per inch respectively. As can be seen already at a density of 85 lines per inch the line pattern appears more "continuous tone" than the standard format.

It follows from the above that a new type of screen pattern, imposed on the film, comprising lines spaced between 100–400 to the inch where the thickness of the line is a function of the density in the original, will provide a continuous tone reproduction, superior to other screens, as will be shown with reference to further figures appended hereto.

EXAMPLE 1

Standard lith film (Agfa DLD510) was exposed through a resolution target and developed in standard lith developer (Agfa G 110C). Segment A of FIG. 2 shows 6μ width black continuous lines on white background. Lines less than 6μ width effectively disappear. White lines on a black background start to appear continuous from a width of about 8μ. At widths smaller than about 8μ, the lines join each other. Good quality printing requires a minimum density (Dmin) of 5–6% in the highlight region and a maximum density (Dmax) of 90–95% in the shadow region. For a 250 lines/in ruling, 5–6% density corresponds to a 5–6μ line width, according to the following calculation: 25 mm=1 in, 1 mm=1000μ.

This calculation generates the following Table:

$$\frac{250 \text{ lines}}{\text{in}} \quad \frac{1 \text{ in}}{25 \text{ mm}} \times \frac{1 \text{ mm}}{1000\mu} \quad \frac{1 \text{ line}}{100\mu}.$$

This calculation generates the following table:

| Density(%) | Line Width(μ) |
|---|---|
| 100(solid black) | 100 |
| 50 | 50 |
| 5 | 5 |

As shown in FIG. 2 a screen ruling of about 250 lines per inch can provide continuous lines even in the highlight region. In the shadow region, the halftone requires only 85–90% density to provide the 90–95% density printed result, because of the limitations of the printing technology at a 250 lines/in resolution. An 8μ width of white lines which corresponds to more than 90% density black remains, as shown in FIG. 2 continuous; i.e. the lines do not join up or close up. Consequently, from the highlight to the shadow region, the image is made up, respectively of continuous and well separated lines. This analysis thus teaches that a ruling in the range of about 250 lines/inch with standard reprographic film and chemistry will produce a superior halftone as described, e.g., hereinafter with reference to FIG. 6.

FIG. 2 also shows that a ruling less than 250 line/in produces continuous, well separated, parallel lines. At high resolution, e.g., 500–600 lines/in, the usable, reproducible and printable lines correspond to too high a Dmin and too low a Dmax, to obtain a good quality image with standard lith film and chemistry since all lower densities do not appear and all higher densities create a solid black image. With a special lith chemistry, as described in U.S. Pat. No. 4,598,040, even this high resolution produces good values of Dmin and Dmax, even though the lines are not absolutely contiguous, as described in example 3 hereinafter.

EXAMPLE 2

FIG. 3 (girl)

An image was exposed through a 55 line/in screen (Beta Screens) onto a standard lith film (Agfa 812) and processed in standard lith developer (Agfa G 90P). This was reduced about 55%, on Agfa 812 film and developed in Agfa G 90P generating a ruling of 100 lines/in. This resultant "line screened" image was exposed onto a standard lith (Agfa 812) and developed in standard lith developer (Agfa G 90P). The resulting black and white contact positive using Agfa-Gevaert Litex paper developed in D-11 is shown in FIG. 3a. As a Control, the same continuous tone image used above was exposed through a conventional dot screen (Agfa Gevaert) with a ruling of 100 dots/in, onto a standard lith film (Agfa 812) and developed in a standard lith developer (Agfa G 90P). The resulting contact positive on Agfa-Gevaert Litex paper developed in D-11 is shown in FIG. 3b. This demonstrates that the "line screen" image produces a smoother transition of tones (i.e. a better continuous tone) relative to a standard screen, in this domain of screen ruling.

EXAMPLE 3

FIG. 4 (Beach Scene)

An Itek continuous tone scanner (Model 200) outputs at 500 lines/in. FIG. 4 shows the results of this 500 line/in output onto a standard scanner film (Agfa 812) using a special lith developer, containing a hydroquinone developing agent in combination with carbonate, bicarbonate and halide salt together with sodium formaldehyde sulfoxylate and formaldehyde as described in U.S. Pat. No. 4,598,040, the teachings of which are incorporated herein by reference. (At this resolution, a color separation can be made without requiring adjustment of angles, to minimize Moire).

Careful inspection of FIG. 4 reveals in the highlight area, relatively continuous lines, comprising short line segments in excess of 5μ wide spaced close enough to each other to give an impression of continuity along their axis, and in the shadows, longer line segments which tend to "close up" partially, near Dmax. As will be realized from this Figure, in the highlight region the width of the line segments are 5–10μ but they generate these low densities by varying the length of the segments at the expense of spacing between the segments on the same lines of the produced halftone. In the shadow region the width of the lines are 40–45μ and continuous. The high resolution of 500 lines per inch or 50μ distance between adjacent lines is obtained because the low density region, e.g., 5% is not comprised of solid black lines of 2.51μ width which is not printable, but rather of line segments 5–10μ wide with suitable spacing between the segments in the produced halftone.

EXAMPLE 4

(FIG. 5)

A color separation set (cyan, magenta, yellow, black) was prepared, where each color was produced electronically as a line screen, each aligned 30 degrees from each other, onto a standard red sensitive scanner film (Anitec) and developed in standard rapid access developer (Anitec), at a ruling of 254 lines/in using a LaserPaint$^{(R)}$Macintosh$^{(R)}$/Linotronic 300$^{(R)}$ System. Contacts of each of the 4 films in the set were made using standard lith film (Agfa) 812) and developing in a special lith developer, as described in U.S. Pat. No. 4,598,040. The resulting color print is shown in FIG. 5a. The control was made using a normal 2-directional electronically generated screen format with a ruling of 254 dots/in the screen, angles being dealt with in the standard way. The resulting color print is shown in FIG. 5b. Note, that in this case, this color separation generates 8 lines effectively (2 for each color) whose relative angles have been considered to minimize Moire vis only 4 lines for the line screen. Offset plates were prepared from these color separations, and they were printed up in the standard way. Comparison of FIG. 5a with FIG. 5b demonstrates that the advantages of a "line screen" for color is even greater than that for black and white.

EXAMPLE 5

(FIG. 6)

A color separation set (cyan, magenta, yellow, black) was prepared, where each color was produced electronically as a line screen, aligned 30 degrees from each other onto a standard red sensitive scanner film (Anitec) and developed in standard rapid access developer (Anitec), at a ruling of 250 lines/in, using a LaserPaint$^R$Macintosh$^R$/Linotronic 300$^R$System. Offset plates were prepared from these color separations, and they were printed up in the standard way. The resulting color print is shown in FIG. 6, which confirms the analysis in Example 1, i.e., at about 250 lines/in, using standard scanner film/chemistry system, a reasonably continuous line is generated in the highlights, a broader and really continuous line in the middletones, without getting a "closing up" (discontinuous) effect (i.e. the lines remain parallel without joining) in the shadows, until the Dmax region is approached.

It will be evident to those skilled in the art that the invention is not limited to the details of the foregoing illustrative embodiments and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A method for producing a color image faithfully representing a continuous-tone color original comprising the steps of:

(a) producing a first half-tone image corresponding to a first color component of the continuous-tone color original, by forming in said first half-tone image a pattern of substantially continuous, substantially parallel lines at a frequency of between about 100 and 400 lines per inch, such that the width of said lines at a given point in the image varies in relation to the optical density of said first color component at a corresponding point in the continuous-tone original, said substantially parallel lines in said first half-tone image having a first line frequency, said substantially parallel lines in said first half-tone image defining a first direction;

(b) producing a second half-tone image corresponding to a second color component of the continuous-tone color original, by forming in said second half-tone image a pattern of substantially continuous, substantially parallel lines at a frequency of between about 100 and 400 lines per inch, such that the width of said lines at a given point in the image varies in relation to the optical density of said second color component at a corresponding point in the continuous-tone original, said substantially parallel lines in said second half-tone image having a second line frequency substantially equal to said first line frequency, said substantially parallel lines in said second half-tone image defining a second direction rotated from said first direction;

(c) producing a third half-tone image corresponding to a third color component of the continuous-tone color original, by forming in said third half-tone image a pattern of substantially continuous, substantially parallel lines at a frequency of between about 100 and 400 lines per inch, such that the width of said lines at a given point in the image varies in relation to the optical density of said third color component at a corresponding point in the continuous-tone original, said substantially parallel lines in said third half-tone image having a third line frequency substantially equal to said first line frequency, said substantially parallel lines in said third half-tone image defining a third direction rotated from both said first direction and said second direction; and (d) combining said first, said second and said third half-tone images in registration.

2. A method according to claim 1, further comprising the step of producing a fourth half-tone image corresponding to a fourth color component of the continuous-tone color original, said step of forming said fourth half-tone image including forming in the image a pattern of substantially continuous, substantially parallel lines at a frequency of between about 100 and 400 lines per inch, such that the width of said lines at a given point in the image varies in relation to the optical density of said fourth color component at a corresponding point in the continuous-tone original, said substantially parallel lines in said fourth half-tone image having a fourth line frequency substantially equal to said first line frequency, said substantially parallel lines in said fourth half-tone image defining a fourth direction, rotated from each of said first direction, said second direction and said third direction.

3. A method according to claim 2, wherein each of said first direction, said second direction, said third direction and said fourth direction are rotated from all other said directions by substantially integer multiples of 30°.

4. A method according to claim 1, wherein said step of forming in the image a pattern of substantially parallel lines is performed using a photomechanical screen.

5. A method according to claim 1, wherein said step of forming in the image a pattern of substantially parallel lines is performed using an electronic scanner.

* * * * *